(12) United States Patent
Aratani (10) Patent No.: US 9,333,618 B2
(45) Date of Patent: May 10, 2016

(54) METHOD FOR ADJUSTING HEIGHT POSITION OF POLISHING HEAD AND METHOD FOR POLISHING WORKPIECE

(75) Inventor: Takashi Aratani, Nishishirakawa (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 14/112,084

(22) PCT Filed: Apr. 25, 2012

(86) PCT No.: PCT/JP2012/002826
§ 371 (c)(1),
(2), (4) Date: Oct. 16, 2013

(87) PCT Pub. No.: WO2012/164820
PCT Pub. Date: Dec. 6, 2012

(65) Prior Publication Data
US 2014/0030957 A1    Jan. 30, 2014

(30) Foreign Application Priority Data
May 27, 2011    (JP) .................... 2011-118744

(51) Int. Cl.
*B24B 49/16* (2006.01)
*B24B 37/04* (2012.01)
(Continued)

(52) U.S. Cl.
CPC .............. *B24B 37/005* (2013.01); *B24B 37/042* (2013.01); *B24B 37/105* (2013.01);
(Continued)

(58) Field of Classification Search
CPC ...... B24B 49/02; B24B 49/16; B24B 37/005; B24B 37/04; B24B 37/042; B24B 37/30; B24B 51/00

USPC ................ 451/9, 10, 11, 41, 54, 63, 285, 287
See application file for complete search history.

(56) References Cited

U.S. PATENT DOCUMENTS

| 5,904,608 A * | 5/1999 | Watanabe ........................ 451/5 |
| 2010/0112901 A1 | 5/2010 | Togawa et al. |

(Continued)

FOREIGN PATENT DOCUMENTS

| CN | 1809444 A | 7/2006 |
| CN | 101053069 A | 10/2007 |

(Continued)

OTHER PUBLICATIONS

International Preliminary Report on Patentability issued in International Patent Application No. PCT/JP2012/002826 dated Dec. 2, 2013.

(Continued)

*Primary Examiner* — Eileen Morgan
(74) *Attorney, Agent, or Firm* — Oliff PLC (57) ABSTRACT

A method for adjusting a height position of a polishing head, comprising moving the polishing head to a height position at which the polishing head comes in noncontact with the polishing pad with the polishing head holding no workpiece, and then rotating at least one of the polishing head and the turn table; measuring the load torque current of the at least one of the polishing head and the turn table rotated with the torque-measuring mechanism while the height-adjusting mechanism moves the polishing head toward the polishing pad until the polishing head contacts the polishing pad, and recording the height position of the polishing head as a reference position when a variation in the measured load torque current exceeds a threshold; and adjusting the height position of the polishing head to the predetermined position on the basis of a distance from the reference position.

4 Claims, 5 Drawing Sheets

(51) Int. Cl.
- B24B 37/005 (2012.01)
- B24B 37/10 (2012.01)
- B24B 49/10 (2006.01)
- B24B 37/30 (2012.01)
- B24B 49/12 (2006.01)
- H01L 21/02 (2006.01)

(52) U.S. Cl.
CPC ............. *B24B 37/30* (2013.01); *B24B 49/10* (2013.01); *B24B 49/12* (2013.01); *B24B 49/16* (2013.01); *H01L 21/02024* (2013.01)

(56) References Cited

U.S. PATENT DOCUMENTS

| | | | |
|---|---|---|---|
| 2010/0291838 A1 | 11/2010 | Masumura et al. | |
| 2010/0311309 A1* | 12/2010 | Shinozaki | 451/5 |
| 2011/0159783 A1 | 6/2011 | Fukushima et al. | |
| 2014/0287653 A1* | 9/2014 | Shimano et al. | 451/5 |

FOREIGN PATENT DOCUMENTS

| | | |
|---|---|---|
| CN | 101607376 A | 12/2009 |
| CN | 101801605 A | 8/2010 |
| JP | A-2002-50593 | 2/2002 |
| JP | A-2009-107094 | 5/2009 |
| TW | 200942362 A | 10/2009 |
| TW | 201016385 A | 5/2010 |
| TW | 201100199 A | 1/2011 |

OTHER PUBLICATIONS

International Search Report issued in International Patent Application No. PCT/JP2012/002826 dated Jun. 19, 2012.
Jun. 5, 2015 Office Action issued in Chinese Application No. 2012800237800.
May 19, 2015 Office Action issued in Taiwanese Application No. 101115475.
Nov. 12, 2015 Office Action and Search Report issued in Taiwanese Patent Application No. 101115475.

* cited by examiner

METHOD FOR ADJUSTING HEIGHT POSITION OF POLISHING HEAD AND METHOD FOR POLISHING WORKPIECE

TECHNICAL FIELD

The present invention relates to a method for adjusting a height position of a polishing head for holding a workpiece, and a method for polishing a workpiece, in a polishing apparatus used in polishing the surface of a workpiece.

BACKGROUND ART

In accordance with high integration of semiconductor devices in recent years, requirements for flattening of semiconductor silicon wafers used therefore have been rigorous more and more. Moreover, in order to increase the yield of semiconductor chips, flatness up to a region in the vicinity of edges of a wafer is required.

A desired shape of the silicon wafer is determined by mirror-polishing process which is the final process. Particularly, in the case of silicon wafers having a large diameter, e.g., a diameter of 300 mm, etc., primary polishing at double-side polishing process is performed in order to satisfy the specification of rigorous flatness thereafter to perform surface-secondary polishing process and the finish polishing process on one side surface for the purpose of improving scratches of the surface and/or surface roughness. In the surface-secondary polishing process and the finish polishing process on one side, it is required to maintain flatness prepared by the double-side primary polishing process, and to finish into a perfect mirror-surface free from defects such as scratches, etc. on the surface side.

Figure 5:
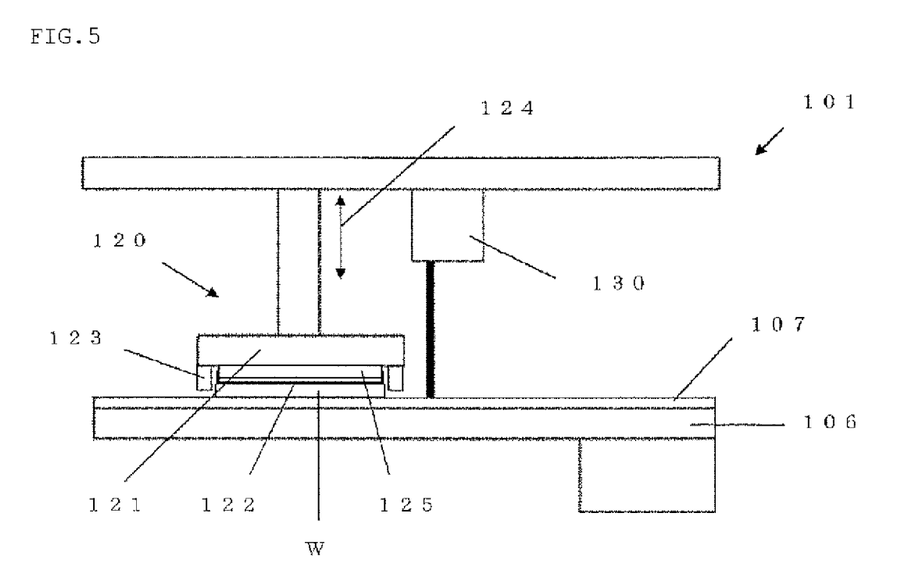
FIG. 5 is a schematic view showing a conventional method for adjusting a height position of a polishing head.

The schematic view of a typical single-side polishing apparatus is illustrated in FIG. 5. This single-side polishing apparatus 101 comprises a turn table 106 on which a polishing pad 107 is stuck, polishing-agent-supplying mechanism (not shown), and a polishing head 120, etc. In such a single-side polishing apparatus 101, a workpiece W is held by means of the polishing head 120 to deliver polishing agent onto the polishing pad 107 from the polishing-agent-supplying mechanism, and to respectively rotate the turn table 106 and the polishing head 120 to allow the surface of the workpiece W to slidably come into contact with the polishing pad 107 to thereby perform polishing.

Examples of a method of holding a workpiece by a polishing head include a method of sticking the workpiece through an adhesive, such as wax, on a flat disc-shaped plate. The other methods include a method of holding a workpiece through an elastic film, called a backing film, adhered on a workpiece holding plate, for the purpose of suppressing an influence of transference of unevenness of a polishing head body and the workpiece holding plate, and a method of pressing a workpiece against a polishing pad by supplying pressurized fluid, such as air, to the back surface of a rubber film, as a workpiece holding member, to inflate the rubber film with an uniform pressure, which is called a rubber-chuck method (See Patent Document 1, for example). Moreover, for the purpose of suppressing sags at an outer circumferential part to improve flatness, there is also proposed a polishing head in which a retainer ring for pressing a polishing pad is disposed on the outside of a workpiece.

An example of the configuration of a conventional polishing head by the rubber-chuck method is illustrated in FIG. 5. The polishing head 120 illustrated in FIG. 5 has a structure, so-called the rubber-chuck structure, in which a rubber film (rubber material) 122 is attached so as to cover at least the lower-surface part and the side-surface part of a disc-shaped mid plate 125, and fluid is supplied to the back surface of the rubber film to press a workpiece W.

An annular guide ring 123 for holding the side surface of the workpiece W during polishing is connected to a polishing head body 121. The polishing head is configured to move the height position of the guide ring 123 vertically with a height-adjusting mechanism 124 connected to the polishing head body 121. The workpiece is stably held and polished while maintaining a constant distance between the polishing pad and the guide ring 123 connected to the polishing head body 121.

As described above, the polishing head presses a workpiece by inflating the rubber film of the polishing head while holding the polishing head at a fixed height to maintain a constant distance between the polishing head and the polishing pad. A polishing head, represented by the above polishing head, using the method of maintain a constant distance between the polishing head and the polishing pad needs to adjust the height position of the polishing head from the polishing pad to the same position in every polishing.

In the case where this height position is not suitably adjusted, in the instance where the flatness of a workpiece to be polished may be degraded, and/or positions every polishing are not uniform, allowance in machining between workpieces to be polished may not become uniform so that unevenness of flatnesses takes place. In the case where such adjustment is poor, when spacing is too narrow, contact between the polishing pad and the guide ring may take place so that the polishing pad is damaged. On the contrary, when the spacing is too broad, there is the risk that wafer may be flied out from a gap between the polishing pad and the guide ring.

A conventional method for adjusting a height position of a polishing head, as illustrated in FIG. 5, involves measuring a distance from the polishing head 120 by using a laser displacement meter 130, disposed near the mounting face of the polishing head 120, and adjusting the height of the polishing head on the basis of the measured distance such that the polishing head keeps a desired distance from the polishing pad 107.

CITATION LIST

Patent Literature

Patent Document 1: Japanese Unexamined Patent Application Publication (Kokai) No. 2009-107094

SUMMARY OF INVENTION

Technical Problem

Since a surface of a polishing pad generally gets wet with a polishing agent, for example, or contains moisture even when it is not wet, the conventional method of measuring the distance by using the laser displacement meter greatly increases variation in the measured distance depending on time, and thus cannot adjust the polishing head to a desired height position stably in every polishing process, resulting in degraded flatness of the workpiece and variation in the flatness among the workpieces.

The present invention has been made in view of the above problems, and it is an object of the present invention to provide a method for adjusting a height position of a polishing head stably with high precision, and a method for polishing a workpiece that can improve the flatness of the workpiece being polished and suppress variation in flatness among the workpieces by adjusting the height position of the polishing head with high precision.

Solution to Problem

To attain the above object, the present invention provides a method for adjusting a height position of a polishing head in a polishing apparatus, the polishing apparatus including: a polishing pad attached onto a turn table; a polishing-agent-supplying mechanism configured to supply a polishing agent to the polishing pad; a polishing head for holding a back surface of a workpiece while holding a side surface of the workpiece by an annular guide ring; a torque-measuring mechanism configured to measure load torque current of at least one of the polishing head and the turn table; and a height-adjusting mechanism configured to move the polishing head in a height direction to adjust a distance between the guide ring and the polishing pad, the polishing apparatus being configured to move the polishing head to a predetermined position with the height-adjusting mechanism, and to polish the workpiece held by the polishing head by pressing the workpiece against the polishing pad, the method comprising the steps of: moving the polishing head to a height position at which the polishing head comes in noncontact with the polishing pad with the polishing head holding no workpiece, and then rotating at least one of the polishing head and the turn table; measuring the load torque current of the at least one of the polishing head and the turn table rotated with the torque-measuring mechanism while the height-adjusting mechanism moves the polishing head toward the polishing pad until the polishing head contacts the polishing pad, and recording the height position of the polishing head as a reference position when a variation in the measured load torque current exceeds a threshold; and adjusting the height position of the polishing head to the predetermined position on the basis of a distance from the reference position.

The adjusting method measures a position of contact between the polishing head and the polishing pad accurately to record the position as the reference position, enabling the height position of the polishing head to be adjusted stably with high precision on the basis of a distance from the accurately measured reference position.

In the step of recording the reference position, the polishing head may be brought into contact with the polishing pad through a sheet-shaped member having a known, uniform thickness.

In this manner, damage of the polishing pad due to the contact of the polishing pad with the polishing head can be surely suppressed.

Moreover, the polishing head may include a disc-shaped mid plate at a lower part of a polishing head body; and a rubber film that is held by the mid plate and covers at least a lower-surface part and a side-surface part of the mid plate, and the polishing head may hold a back surface of the workpiece at a lower-surface part of the rubber film by a rubber-chuck method.

The method for adjusting a height position of a polishing head of the invention is preferably applied to a polishing apparatus including the polishing head by the rubber-chuck method of polishing the workpiece while holding the polishing head at a fixed height to maintain a constant distance between the polishing head and the polishing pad.

Furthermore, the present invention provides a method for polishing a workpiece, the method comprising holding the workpiece with a polishing head; and pressing the workpiece against a polishing pad attached to a turn table while supplying a polishing agent to the polishing pad, wherein the height position of the polishing head is adjusted by the method for adjusting a height position of a polishing head according to the present invention, and then the workpiece is polished.

The polishing method thus polishes the workpiece after the height position of the polishing head is adjusted with high precision by the method for adjusting a height position of a polishing head of the invention, enabling the flatness of the workpiece to be improved and the variation in flatness among the workpieces to be suppressed.

Advantageous Effects of Invention

According to the present invention, in adjustment of a height position of a polishing head in a polishing apparatus, the load torque current of the at least one of the polishing head and the turn table rotated is measured with the torque-measuring mechanism while the height-adjusting mechanism moves the polishing head toward the polishing pad until the polishing head contacts the polishing pad, and the height position of the polishing head is recorded as a reference position when a variation in the measured load torque current exceeds a threshold, and the height position of the polishing head is adjusted to the predetermined position on the basis of a distance from the reference position. The invention can thereby measure the position of contact between the polishing head and the polishing pad accurately to record the position as the reference position, enabling the height position of the polishing head to be adjusted stably with high precision on the basis of a distance from the accurately measured reference position. Since the workpiece is polished after the height position of the polishing head is adjusted with high precision, the flatness of the workpiece can be improved and the variation in flatness among the workpieces can be suppressed.

DESCRIPTION OF EMBODIMENTS

Hereinafter, embodiments of the present invention will be described, but the present invention is not limited to these embodiments.

The polishing of a workpiece, using the polishing head by the method of maintaining a constant distance between the polishing head and the polishing pad, needs to adjust the height position of the polishing head from the polishing pad accurately and to eliminate variation thereof in every polishing.

Unfortunately, the conventional adjusting method involves adjusting the height of the polishing head to keep a desired distance between a polishing head and a polishing pad on the basis of the distance between the polishing head and the polishing pad, measured by using a laser displacement meter, thereby arising a problem in that moisture or swelling of the polishing pad may affect the distance measured by the laser displacement meter to produce measurement noise, which causes the variation.

In view of the above, the inventor has energetically made studies in order to solve such a problem. As a result, the present inventor found the following:

The position of contact between the polishing head and the polishing pad can be accurately measured by observing load torque current of the polishing head or the turn table, more specifically, by finding a position of the polishing head at which the load torque current abruptly changes. The accurately measured distance is recorded as the reference position to adjust the height position of the polishing head stably with high precision. The inventor thereby completed the invention.

The method for adjusting a height position of a polishing head in a polishing apparatus and the method for polishing a workpiece of the present invention will be specifically described below with reference to drawings, but the present invention is not limited thereto.

Figure 1:
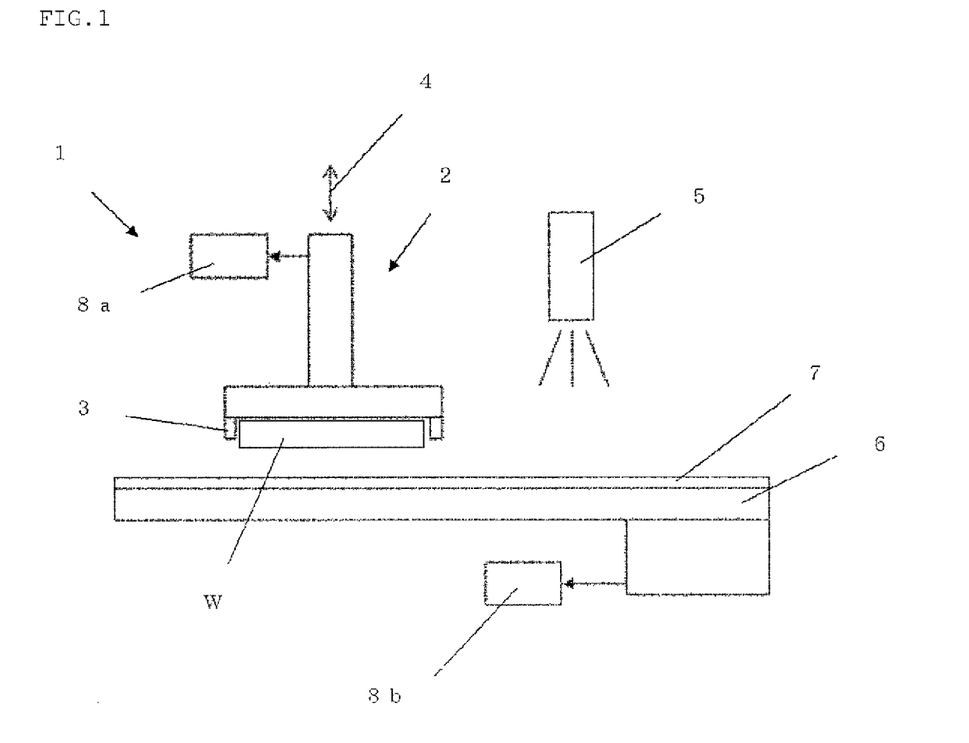
FIG. 1 is a schematic view showing a method for adjusting a height position of a polishing head and a method for polishing a workpiece of the present invention.

FIG. 1 is a schematic view showing a method for adjusting a height position of a polishing head and a method for polishing a workpiece of the present invention.

A polishing apparatus 1 illustrated in FIG. 1 mainly includes a polishing head 2, a turn table 6, a polishing pad 7 attached onto the turn table 6, a polishing-agent-supplying mechanism 5 configured to supply a polishing agent to the polishing pad 7, and torque-measuring mechanisms 8a and 8b configured to measure the load torque current of each of the polishing head 2 and the turn table 6.

The polishing head 2 is provided with an annular guide ring 3, projecting toward the polishing pad, along its outer circumferential part, and configured to hold the back surface of the workpiece W while holding the side surface of the workpiece W by the guide ring 3.

The polishing apparatus 1 includes a height-adjusting mechanism 4 configured to move the polishing head 2 in a height direction to adjust a distance between the guide ring 3 and the polishing pad 7.

The polishing apparatus 1 can use the later-described polishing head of the rubber-chuck method as the polishing head 2 for holding the workpiece W. Alternatively, the apparatus may use a polishing head configured to hold the back surface of the workpiece W through a backing pad and to press the workpiece W by ejecting fluid through openings provided in the polishing head from the back side of the workpiece W toward the polishing pad.

Figure 2:
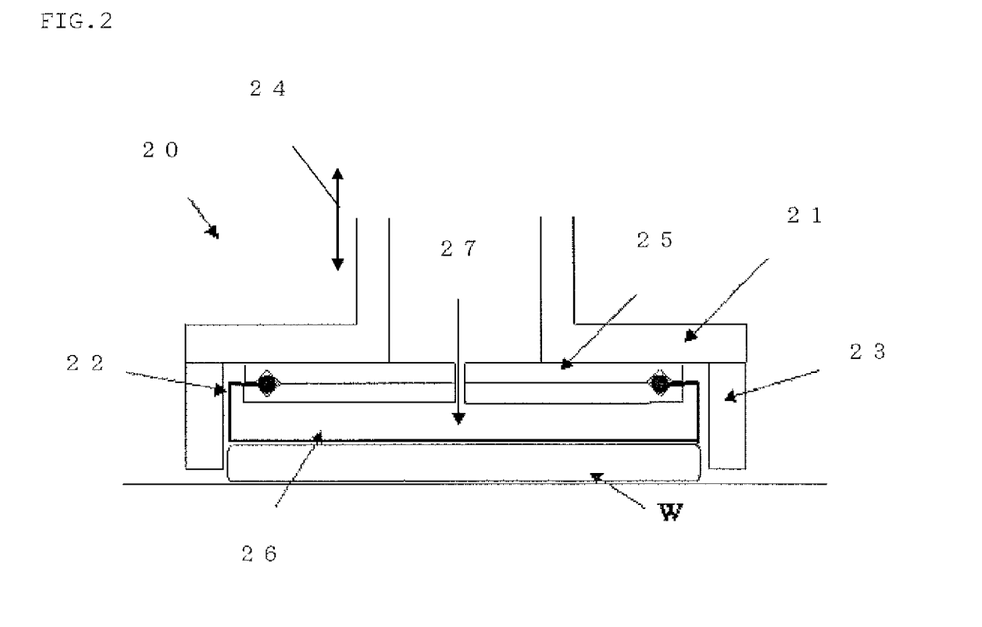
FIG. 2 is a schematic view illustrating one example of a polishing head by the rubber-chuck method.

FIG. 2 is a schematic view illustrating one example of a polishing head by the rubber-chuck method.

This polishing head 20 mainly includes a polishing head body 21, a rubber film 22, an annular guide ring 23, a height-adjusting mechanism 24, and a disc-shaped mid plate 25. The rubber film 22, held by the mid plate 25, covers at least the lower-surface part and the side-surface part of the mid plate 25, and configured to hold the back surface of the workpiece W on the lower surface part of the rubber film 22.

The mid plate 25 is fixed at the polishing head body 21 having a flange structure. The guide ring 23, for holding the side surface of the workpiece W during polishing, is disposed along the outermost circumference of the workpiece W, and connected to the polishing head body 21. The polishing head has a structure in which fluid, supplied by a pressure-adjusting mechanism 27 to a sealed space 26 sealed with the rubber film 22, inflates the rubber film 22 to apply a load to the back surface of the held workpiece W.

In polishing of the workpiece W with the polishing apparatus 1, first, the workpiece W is held by the polishing head 2 as illustrated in FIG. 1. Next, the polishing head 2 is moved to a predetermined position with the height-adjusting mechanism 4, that is, the height position of the polishing head 2 is adjusted to keep a predetermined distance between the polishing pad 7 and the guide ring 3. Then, the held workpiece W is pressed against the polishing pad 7 with the polishing head 2 held at the adjusted position to polish the workpiece.

The present invention is directed to a method of adjusting a height position of a polishing head in such a polishing apparatus.

A method of adjusting a height position of a polishing head the present invention will now be described in detail with reference to FIG. 1.

First, the polishing head 2 is moved to a height position at which the polishing head 2 does not contact the polishing pad 7 without holding the workpiece W by the polishing head. Then, at least one of the polishing head 2 and the turn table 6 is rotated. Both the polishing head 2 and the turn table 6 may be rotated, or either one of them may be rotated, as long as the target of the rotation matches that of the later-described measurement of load torque current.

Next, the polishing head 2 is moved toward the polishing pad 7 with the height-adjusting mechanism 4 until the polishing head 2 contacts the polishing pad 7, while at least one of the polishing head 2 and the turn table 6 is rotated. That is, the polishing head 2 is moved downward to bring the guide ring 3, which is located at the lowermost end of the polishing head 2, into contact with the polishing pad 7. At this time, a speed of the movement is preferably adjusted to prevent the polishing pad 7 from damaging due to contact with the guide ring 3.

Alternatively, the polishing head 2 may be brought into contact with the polishing pad 7 through a sheet-shaped member having a known, uniform thickness. In this manner, damage of the polishing pad due to the contact of the polishing pad with the polishing head can be surely suppressed, and the sheet-shaped member having a known, uniform thickness does not affect adversely the adjustment of the height position of the polishing head.

Simultaneously with the movement of the polishing head 2 toward the polishing pad 7, the load torque current of at least one of the polishing head 2 and the turn table 6 rotated is measured with the torque-measuring mechanisms 8a and 8b, respectively. The height position of the polishing head 2 is recorded as the reference position, when a variation in the measured load torque current exceeds a threshold, which may conclude that the polishing head 2 is into contact with the polishing pad 7. At this time, whether the variation exceeds the threshold can be determined either by the load torque current of both the polishing head and the turn table or by that of one of the polishing head and the turn table.

Accordingly, the reference position, i.e., the position of contact between the polishing head and the polishing pad, can be recorded accurately without measurement variation in every process.

The height position of the polishing head 2 is adjusted to a predetermined position on the basis of a distance from the reference position accurately recorded. Such a method for adjusting a height position of a polishing head of the invention enables the height position of the polishing head to be adjusted with high precision stably more than the conventional method, on the basis of the distance from the reference position, accurately measured without the variation.

A method for polishing a workpiece of the present invention will now be described with reference to FIG. 1.

The above processes until the recording of the reference position are performed in accordance with the method for adjusting a height position of a polishing head of the present invention. After the recording of the reference position, a workpiece W to be polished is held by the polishing head 2. The height position of the polishing head 2 is adjusted to a predetermined position on the basis of the distance from the recorded reference position.

At this time, the height position of the polishing head 2 can be adjusted to a predetermined position at which the distance between the guide ring and polishing pad is 25 to 45% of a workpiece thickness, for example. This distance prevents decrease in the polishing rate, which is caused by a shortage of polishing agent due to excessively short distance between the guide ring and polishing pad, and also inability to hold the workpiece during polishing, which is caused by excessively long distance between the guide ring and polishing pad.

Then, the polishing head and the turn table are each rotated under predetermined polishing conditions, and the workpiece W is pressed against the polishing pad attached on to the turn table while the polishing agent is supplied to the polishing pad to polish the workpiece W. The polishing conditions are not particularly limited, and may be any conditions generally used.

The polishing head may be the polishing head by the rubber-chuck method as illustrated in FIG. 2, which is configured to hold a workpiece stably while maintaining a desired height position and to polish the workpiece while applying an uniform polishing load over the workpiece. The method for adjusting a height position of a polishing head of the invention, which enables the height position of the polishing head to be adjusted stably with high precision, is applied to such a polishing head by the rubber-chuck method to stably polish a workpiece with more improved flatness.

EXAMPLE

The present invention will now be described more specifically with reference to an example according to the present invention and a comparative example, but the present invention is not limited to this example.

Example

A workpiece was polished in accordance with a method for adjusting a height position of a polishing head and a method for polishing a workpiece of the present invention, and then the flatness thereof was evaluated.

A polishing apparatus as illustrated in FIG. 1 having a polishing head by the rubber-chuck method as illustrated in FIG. 2 was used to polish 100 silicon wafers each having a diameter of 300 mm. The maximum value, the minimum value, and the average value of the flatness, and variation in the flatness of each polished wafer were then evaluated. The flatness was evaluated by global backside ideal range (GBIR) within a region except for the outer circumferential part of 2 mm using Wafersight made by KLA Co. Ltd.

First, the height position of the polishing head was adjusted such that the distance between the guide ring of the polishing head and the surface of the polishing pad became 190 mm, in accordance with the method for adjusting a height position of a polishing head of the present invention.

Figure 3:
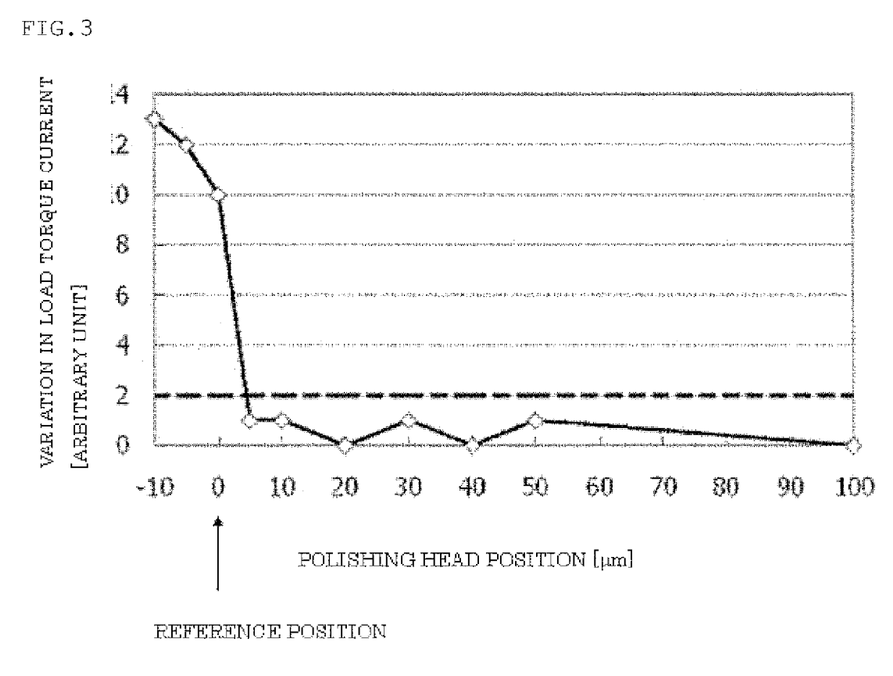
FIG. 3 is a view showing variations in the load torque current measured in Example.

At this time, only the turn table was rotated to measure the load torque current of the turn table. FIG. 3 shows variations in the measured load torque current with respect to the height positions of the polishing head when the recorded reference position was converted into zero. As illustrated in FIG. 3, the reference position corresponds to the height position of the polishing head when the variation in the load torque current abruptly changes and exceeds a threshold of 2 (arbitrary unit).

Next, the height position of the polishing head was adjusted to a position of 190 μm upward from the reference position, and a silicon wafer was then polished. In this example, the polishing conditions were as follows: An alkali solution containing colloidal silica was used as the polishing agent; an unwoven cloth impregnated with urethane, having grooves was used as the polishing pad; the polishing head and the turn table were each rotated at 30 rpm; the polishing load was 25 kPa; and the polishing time was 100 sec.

The adjustment of the height position of the polishing head and polishing of the silicon wafer were repeated for 100 silicon wafers, and the flatness thereof was evaluated.

As a result, as illustrated in Table 1, the maximum value of GBIR was 120 nm, the minimum value thereof was 88 nm, and the average value thereof was 103 nm, which were improved in comparison with a maximum value of 164 nm, a minimum value of 91 nm and an average value of 120 nm of the later-described Comparative Example. The difference between the maximum value and the minimum value was 32 nm in the example, whereas the difference thereof was 73 nm in the later-described Comparative Example, which exhibited improved variation in Example. This improvement revealed that the height position of the polishing head was adjusted stably with high precision in every polishing process.

The adjusting method and polishing method of the present invention thus can adjust the height position of the polishing head stably with high precision, improve the flatness of the workpiece being polished and suppress variation in flatness among the workpieces.

Comparative Example

With a conventional polishing apparatus as illustrated in FIG. 5, the height position of the polishing head was adjusted by using a laser displacement meter, and a silicon wafer was polished under the same polishing conditions as those of Example. This operation was repeated for 100 silicon wafers, and the same evaluation was made as with Example.

Figure 4:
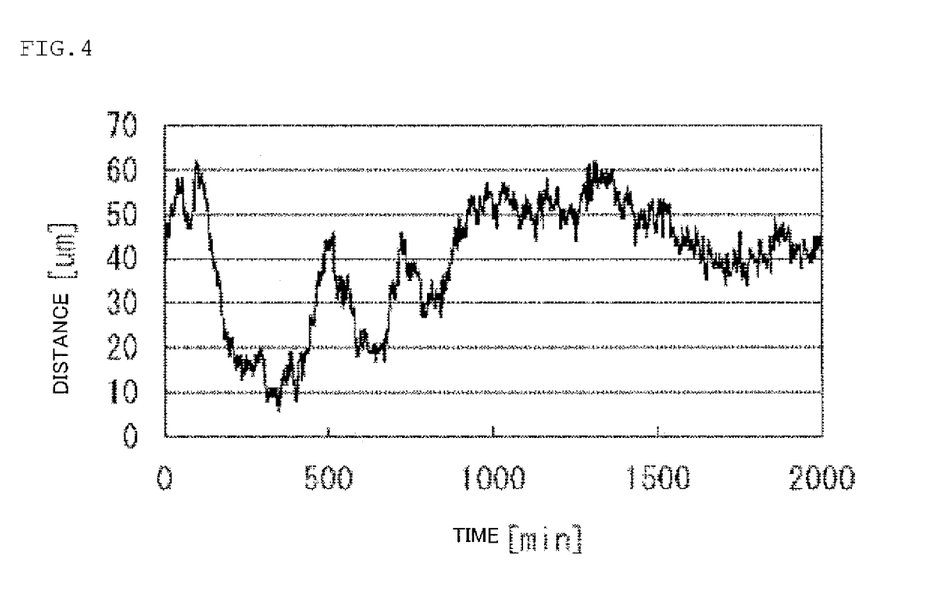
FIG. 4 is a view showing results of the measured distance between the polishing head and the polishing pad in Comparative Example.

The result of the measured distance between the polishing head and the polishing pad by using the laser displacement meter was shown in FIG. 4. FIG. 4 shows change in the distance between the polishing head and the polishing pad over time, which was measured in every polishing process. As illustrated in FIG. 4, the distance greatly changes with lapse of time.

Moreover, the measured results of the flatness are shown in the Table 1. As shown in the Table 1, the maximum value of the GBIR was 164 nm, the minimum value thereof was 91 nm and the average value thereof was 120 nm, which were degraded as compared to Example. This result is considered to be caused by the following reason: The height position of the polishing head was adjusted to an improper position due to measurement error of the distance between the polishing head and the polishing pad by the laser displacement meter. In addition, the difference between the maximum value and the minimum value was 73 nm, which was degraded as compared to Example. This result is considered to be caused by variation in the height position of the polishing head adjusted in every polishing process.

TABLE 1

| | GBIR (nm) | | | |
|---|---|---|---|---|
| | Maximum | Minimum | Average | Maximum − Minimum |
| Example | 120 | 88 | 103 | 32 |
| Comparative example | 164 | 91 | 120 | 73 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for adjusting a height position of a polishing head in a polishing apparatus, the polishing apparatus including:
a polishing pad attached onto a turn table; a polishing-agent-supplying mechanism configured to supply a polishing agent to the polishing pad; a polishing head configured to hold a back surface of a workpiece while holding a side surface of the workpiece by an annular guide ring; a torque-measuring mechanism configured to measure load torque current of at least one of the polishing head and the turn table; and a height-adjusting mechanism configured to move the polishing head in a height direction to adjust a distance between the guide ring and the polishing pad,
the polishing apparatus being configured to move the polishing head to a predetermined position with the height-adjusting mechanism, and to polish the workpiece held by the polishing head by pressing the workpiece against the polishing pad, the method comprising the steps of:
moving the polishing head to a height position at which the polishing head comes in noncontact with the polishing pad with the polishing head holding no workpiece, and then rotating at least one of the polishing head and the turn table;
measuring the load torque current of the at least one of the polishing head and the turn table rotated with the torque-measuring mechanism while the height-adjusting mechanism moves the polishing head toward the polishing pad until the polishing head is brought into contact with a sheet-shaped member having a known and uniform thickness disposed on the polishing pad and a variation in the measured load torque current exceeds a threshold, and recording the height position of the polishing head as a reference position when the variation in the measured load torque current exceeds the threshold; and
adjusting the height position of the polishing head to the predetermined position on the basis of a distance from the reference position.

2. The method for adjusting a height position of a polishing head according to claim 1, wherein the polishing head includes a disc-shaped mid plate at a lower part of a polishing head body; and a rubber film that is held by the mid plate and covers at least a lower-surface part and a side-surface part of the mid plate, the polishing head holding a back surface of the workpiece at a lower-surface part of the rubber film by a rubber-chuck method.

3. A method for polishing a workpiece, the method comprising holding the workpiece with a polishing head; and pressing the workpiece against a polishing pad attached to a turn table while supplying a polishing agent to the polishing pad, wherein the height position of the polishing head is adjusted by the method for adjusting a height position of a polishing head according to claim 1, and then the workpiece is polished.

4. A method for polishing a workpiece, the method comprising holding the workpiece with a polishing head; and pressing the workpiece against a polishing pad attached to a turn table while supplying a polishing agent to the polishing pad, wherein the height position of the polishing head is adjusted by the method for adjusting a height position of a polishing head according to claim 2, and then the workpiece is polished.

* * * * *